(12) United States Patent
Kim et al.

(10) Patent No.: US 11,417,618 B2
(45) Date of Patent: Aug. 16, 2022

(54) SEMICONDUCTOR DEVICE INCLUDING REDISTRIBUTION LAYER AND METHOD FOR FABRICATING THE SAME

(71) Applicant: SK hynix Inc., Icheon-si (KR)

(72) Inventors: Seung Hwan Kim, Icheon-si (KR);
Hyun Chul Seo, Icheon-si (KR);
Hyeong Seok Choi, Icheon-si (KR);
Shin Young Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/993,079

(22) Filed: Aug. 13, 2020

(65) Prior Publication Data
US 2021/0202415 A1 Jul. 1, 2021

(30) Foreign Application Priority Data

Dec. 26, 2019 (KR) .................. 10-2019-0175172
Mar. 18, 2020 (KR) .................. 10-2020-0033258

(51) Int. Cl.
*H01L 23/00* (2006.01)
*H01L 23/31* (2006.01)
(Continued)

(52) U.S. Cl.
CPC ...... *H01L 24/05* (2013.01); *H01L 2224/0235* (2013.01); *H01L 2224/02331* (2013.01); *H01L 2224/02372* (2013.01)

(58) Field of Classification Search
CPC .......... H01L 23/28; H01L 23/31–3114; H01L 24/94; H01L 2224/94; H01L 23/3171–3192; H01L 23/291–298; H01L 2224/022–02215; H01L 2224/0391; H01L 2224/1191; H01L 2224/2791; H01L 2224/03916; H01L 2224/1148;
(Continued)

(56) References Cited

U.S. PATENT DOCUMENTS

2017/0154850 A1* 6/2017 Kao .................... H01L 23/3171
2018/0005967 A1 1/2018 Yajima
(Continued)

OTHER PUBLICATIONS

Seok-Hwan Huh et al., Chlorine effect on ion migration for PCBs under temperature-humidity bias test, Journal of Welding and Joining, 2015, pp. 47-53, vol. 33 No. 3, ISSN 1225-6153, Online ISSN 2287-8955, http://dx.doi.org/10.5781/JWJ.2015.33.3.47, Busan, Republic of Korea.

(Continued)

*Primary Examiner* — Sonya McCall-Shepard
(74) *Attorney, Agent, or Firm* — William Park & Associates Ltd.

(57) ABSTRACT

A semiconductor device includes: a lower structure; a redistribution insulating layer disposed over the lower structure; a redistribution conductive layer disposed over the redistribution insulating layer and electrically connected to a part of the lower structure, the redistribution conductive layer including a redistribution pad; and a protective layer covering the redistribution insulating layer and the redistribution conductive layer while leaving the redistribution pad exposed. The redistribution conductive layer includes a trench disposed adjacent to the redistribution pad, and a part of the protective layer fills the trench.

23 Claims, 18 Drawing Sheets

(51) Int. Cl.
*H01L 23/498* (2006.01)
*H01L 21/48* (2006.01)

(58) Field of Classification Search
CPC ... H01L 2224/11916; H01L 2224/2748; H01L 2224/27916; H01L 23/3135; H01L 2224/023–024; H01L 21/00; H01L 24/00; H01L 27/14632; H01L 2224/0237; H01L 2224/02373; H01L 2224/02375; H01L 2224/02377; H01L 2224/02379; H01L 2224/02381; H01L 2224/02372; H01L 2224/02371; H01L 2224/48145; H01L 2224/48151; H01L 2224/484
See application file for complete search history.

(56) References Cited

U.S. PATENT DOCUMENTS

2020/0091070 A1\* 3/2020 Chi .................. H01L 24/08
2020/0105634 A1\* 4/2020 Huang ............... H01L 24/08

OTHER PUBLICATIONS

Support for Test Analysis & Equipment Utilization, Reliability Test Service, Environmental Test, http://www.qrtkr.com/html/en/te_reliabilitytest_environ_1.asp, Icheon-si, Gyeonggi-do, Republic of Korea.

\* cited by examiner

SEMICONDUCTOR DEVICE INCLUDING REDISTRIBUTION LAYER AND METHOD FOR FABRICATING THE SAME

CROSS-REFERENCE TO RELATED APPLICATION

This application claims priority under 35 U.S.C. § 119 to Korean Patent Application No. 10-2019-0175172 filed on Dec. 26, 2019, and Korean Patent Application No. 10-2020-0033258 filed on Mar. 18, 2020, which are incorporated herein by reference in their entirety.

BACKGROUND

1. Technical Field

Embodiments relate to a semiconductor device, and more particularly, to a semiconductor device including a redistribution layer.

2. Related Art

A semiconductor device may include an integrated circuit for performing various functions. In order to connect such a semiconductor device to an external terminal, it may be necessary to form a redistribution layer.

The redistribution layer may be mainly formed in a fab-out state of a wafer in which a circuit pattern is formed, that is, in a packaging process. However, in some cases, the redistribution layer may be formed together with the circuit pattern in a front-end process of forming the circuit pattern in the wafer.

SUMMARY

Various embodiments are directed to a semiconductor device which may prevent process defects while securing reliability and operating characteristics, and a method for fabricating the same.

In an embodiment, a semiconductor device may include: a lower structure; a redistribution insulating layer disposed over the lower structure; a redistribution conductive layer disposed over the redistribution insulating layer and electrically connected to a part of the lower structure, the redistribution conductive layer including a redistribution pad; and a protective layer covering the redistribution insulating layer and the redistribution conductive layer while leaving the redistribution pad exposed. The redistribution conductive layer may include a trench disposed adjacent to the redistribution pad, and a part of the protective layer may fill the trench.

In an embodiment, a method for fabricating a semiconductor device may include: forming a lower structure; forming a redistribution insulating layer over the lower structure; forming a redistribution conductive layer over the redistribution insulating layer, the redistribution conductive layer including a trench formed therein and a redistribution pad; and forming a protective layer covering the redistribution insulating layer and the redistribution conductive layer while leaving the redistribution pad exposed. The trench may be disposed adjacent to the redistribution pad, and a part of the protective layer may fill the trench.

DETAILED DESCRIPTION

Figure 1:
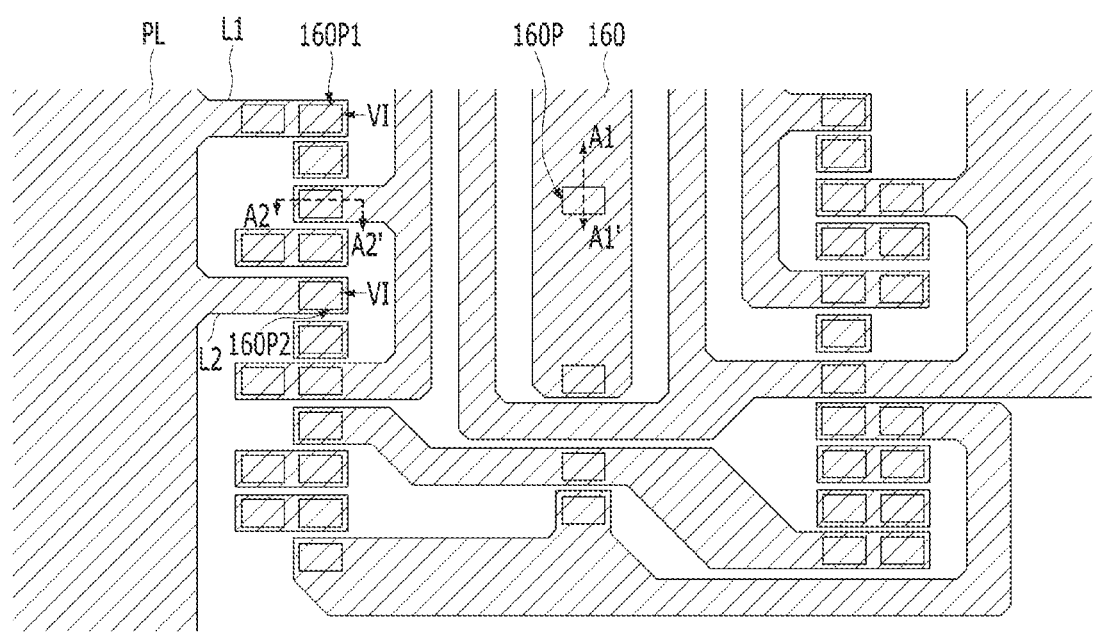
FIG. 1 is a plan view illustrating a redistribution conductive layer of a semiconductor device according to an embodiment of the present disclosure.

Various examples and implementations of the disclosed technology are described below in detail with reference to the accompanying drawings.

The drawings may not be necessarily to scale, and in some instances, proportions of at least some structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 2:
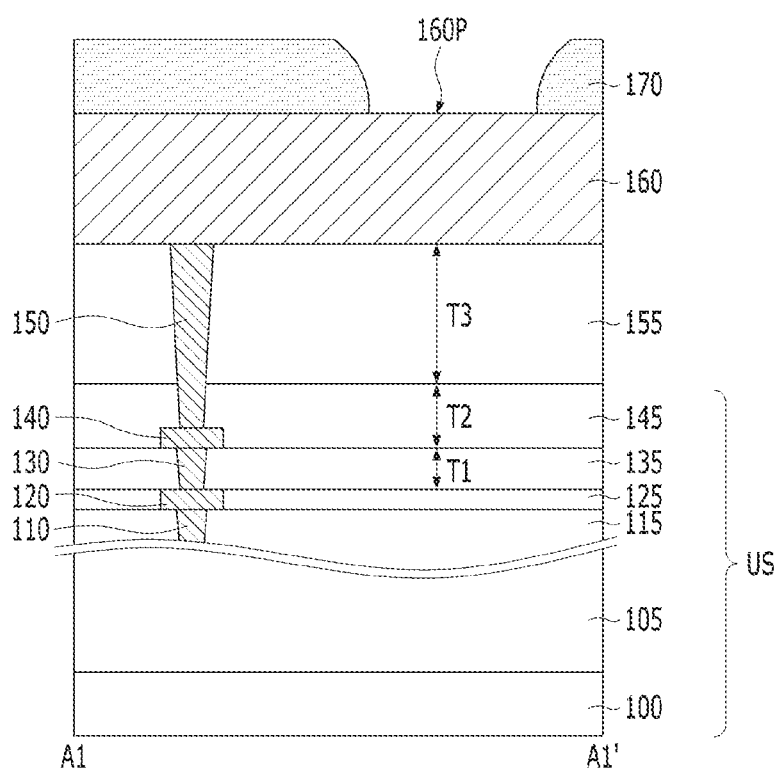
FIGS. 2 and 3 are cross-sectional views illustrating a semiconductor device according to an embodiment of the present disclosure.
Figure 3:
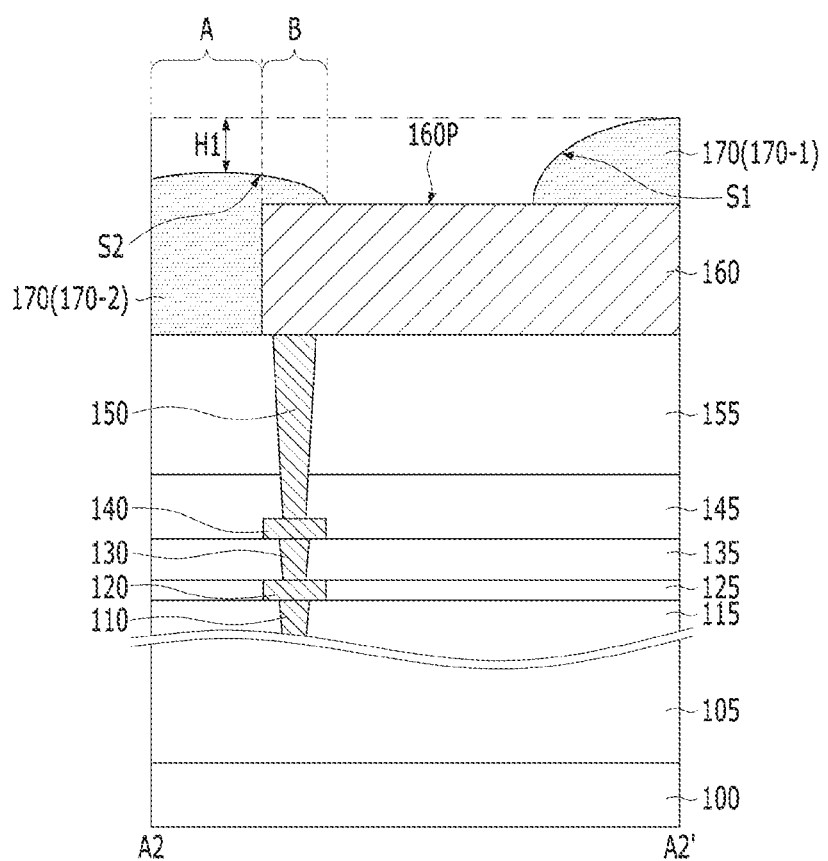

FIGS. 1 to 3 are views illustrating a semiconductor device according to an embodiment of the present disclosure, and a method for fabricating the same. Specifically, FIG. 1 is a plan view illustrating a redistribution conductive layer of a semiconductor device according to an embodiment of the present disclosure. FIGS. 2 and 3 are cross-sectional views illustrating a semiconductor device according to an embodiment of the present disclosure. FIGS. 2 and 3 are cross-sectional views taken along lines A1-A1' and A2-A2' of FIG. 1, respectively.

Referring to FIGS. 1 to 3, the semiconductor device of the present embodiment may include a lower structure US, a redistribution insulating layer 155 formed over the lower structure US, a redistribution conductive layer 160 formed over the redistribution insulating layer 155 and electrically connected to a part of the lower structure US, and a protective layer 170 covering the redistribution conductive layer 160 and the redistribution insulating layer 155 while having an opening to expose a part of the redistribution conductive layer 160.

The lower structure US may include a semiconductor substrate 100 and a multi-layered conductive and/or insulating pattern formed over one surface of the semiconductor substrate 100. The semiconductor substrate may include a semiconductor material such as silicon. The multi-layered conductive and/or insulating pattern may form an integrated circuit.

As an example, a lower portion of the lower structure US may include the semiconductor substrate 100 and a first interlayer insulating layer 105 formed over the semiconductor substrate 100. Although not illustrated, transistors, contacts, conductive lines, or the like may be formed in the first interlayer insulating layer 105. An upper portion of the lower structure US may include multi-layered conductive patterns 110, 120, 130, and 140, and second to fifth interlayer insulating layers 115, 125, 135, and 145 in which the multi-layered conductive patterns 110, 120, 130, and 140 are embedded. In the present embodiment, the upper portion of the lower structure US may include a second interlayer insulating layer 115 formed over the first interlayer insulating layer 105, a first contact 110 penetrating through the second interlayer insulating layer 115 and connected to a conductive pattern (not shown) positioned below the second interlayer insulating layer 115, a first pad 120 formed over the second interlayer insulating layer 115 and connected to the first contact 110, a third interlayer insulating layer 125 formed over the second interlayer insulating layer 115 and surrounding side surfaces of the first pad 120, a fourth interlayer insulating layer 135 covering the first pad 120 and the third interlayer insulating layer 125, a second contact 130 penetrating through the fourth interlayer insulating layer 135 and connected to the first pad 120, a second pad 140 formed over the fourth interlayer insulating layer 135 and connected to the second contact 130, and a fifth interlayer insulating layer 145 formed over the fourth interlayer insulating layer 135 and covering the second pad 140. However, the present embodiment is not limited to that illustrated, and the shape, structure, or the like of the conductive/insulating pattern included in the lower structure US may be variously modified.

Meanwhile, a material used for the conductive/insulating pattern included in the lower structure US may be appropriately selected in order to satisfy the required characteristics of the semiconductor device. In particular, a metal such as copper (Cu) having a low resistance may be used as a conductive pattern, and a material having a low dielectric constant, i.e., a low-k material, may be used as an insulating layer filling between conductive patterns. As an example, the first contact 110 and/or the first pad 120 may include copper, and the second interlayer insulating layer 115 and/or the third interlayer insulating layer 125, surrounding the first contact 110 and/or the first pad 120, may include a low-k material having a dielectric constant of 2.7 or less. The fourth interlayer insulating layer 135 and the fifth interlayer insulating layer 145 may include a conventional insulating material, for example, silicon oxide.

However, if the semiconductor device is packaged by covering a surface of the semiconductor device with the protective layer 170 and performing a fab-out process in a state in which only the lower structure US is formed, moisture may penetrate through the fourth interlayer insulating layer 135 and the fifth interlayer insulating layer 145 to the second interlayer insulating layer 115 and/or the third interlayer insulating layer 125 including a low-k material that is relatively vulnerable to moisture absorption. This moisture may cause electrical movement of metal ions, particularly copper ions. Accordingly, an electrical short may occur between the first contact 110 and another adjacent contact (not shown) or between the first pad 120 and another adjacent pad (not shown). Therefore, in the present embodiment, in order to prevent such a problem, the redistribution insulating layer 155 and the redistribution conductive layer 160 may be additionally formed over the lower structure US, before the fab-out.

The redistribution insulating layer 155 may include an insulating material having a higher dielectric constant and/or a lower moisture absorption rate than the low-k material. As an example, the redistribution insulating layer 155 may include silicon oxide, silicon nitride, or a combination thereof. In addition, the redistribution insulating layer 155 may have a single-layered structure or a multi-layered structure. The redistribution insulating layer 155 may be formed to be relatively thick to prevent moisture penetration. For example, a thickness T3 of the redistribution insulating layer 155 may be greater than a thickness T1 of the fourth interlayer insulating layer 135, a thickness T2 of the fifth interlayer insulating layer 145, and/or a sum of the thicknesses of the fourth and fifth interlayer insulating layers 135 and 145, that is, T1+T2.

The redistribution conductive layer 160 may be formed over the redistribution insulating layer 155. The redistribution conductive layer 160 may be formed to be relatively thick for transmitting signals easily. For example, a thickness of the redistribution conductive layer 160 may be the same as or similar to the thickness T3 of the redistribution insulating layer 155. In addition, the redistribution conductive layer 160 may include various conductive materials. For example, the redistribution conductive layer 160 may include a metal such as aluminum (Al). The redistribution conductive layer 160 may have a single-layered structure or a multi-layered structure.

The redistribution conductive layer 160 may be connected to an uppermost conductive pattern of the lower structure US, for example, the second pad 140. To this end, a third contact 150 may be formed in the redistribution insulating layer 155 and the fifth interlayer insulating layer 145 to penetrate through the redistribution insulating layer 155 and the fifth interlayer insulating layer 145. An upper surface of the third contact 150 may be connected to the redistribution conductive layer 160 and a lower surface of the third contact 150 may be connected to the second pad 140.

A part of the upper surface of the redistribution conductive layer 160 may be exposed through the opening of the protective layer 170. Hereinafter, the exposed part of the redistribution conductive layer 160 will be referred to as a redistribution pad 160P. The redistribution pad 160P may be a part to which a connection terminal (not shown) for electrically connecting the semiconductor device of the present embodiment to an external device is bonded.

A plurality of redistribution pads 160P may be arranged in various forms as needed, and various signals, various levels of power, or the like may be applied to the redistribution pads 160P. A plurality of redistribution conductive layers 160 may also be arranged in various forms while having various shapes, as needed. In particular, the redistribution pads 160P to which the same power is applied may be connected to each other using the redistribution conductive layer 160. This is for effective supply of power used during the operation of the semiconductor device. As an example, as shown in FIG. 1, a first redistribution pad 160P1 and a second redistribution pad 160P2 to which the same first voltage V1 is applied may be connected to each other by the redistribution conductive layer 160 which includes a first line portion L1 overlapping the first redistribution pad 160P1 and extending to a left side thereof, a second line portion L2 overlapping the second redistribution pad 160P2 and extending to a left side thereof, and a plate portion PL disposed at a left side of the first and second line portions L1 and L2 and commonly connected to the first and second line portions L1 and L2. In another embodiment, the redistribution conductive layer 160 may have various curved line shapes, plate shapes, or combinations thereof while connecting the redistribution pads 160P to which the same power is applied to each other. If the semiconductor device of the present embodiment is a semiconductor memory operating at high speed, a large amount of charges may transfer instantaneously in the operation of storing or erasing data. At this time, if the supply of charges does not occur immediately, a problem may occur in data integrity. However, as in the present embodiment, if the redistribution pads 160P to which the same power is applied are connected to each other to form a power distribution network (PDN), it may be possible to cope with the instantaneous voltage change, thereby addressing this problem.

The protective layer 170 may function to define the redistribution pad 160P while protecting the semiconductor device of the present embodiment. The protective layer 170 may have a single-layered structure or a multi-layered structure including various insulating materials such as an insulating polymer. In particular, the protective layer 170 may include a polyimide material such as Polyimide Isoindro Quindzoline (PIQ).

The protective layer 170 may have a step height because of a step height of the structure thereunder, that is, a step height between an area where the redistribution conductive layer 160 is present and an area where the redistribution conductive layer 160 is not present. As described above, because the thickness of the redistribution conductive layer 160 is considerably large, the step height in the protective layer 170 and in the structure under the protective layer 170 may also be considerably large. In addition, side surfaces of the protective layer 170, which surround the redistribution pad 160P, may have different slopes due to the step height of the structure disposed under the protective layer 170. More specifically, in a polymer coating process for forming the protective layer 170, a surface of the coated polymer may have a step height due to the step height of the structure disposed under the protective layer 170. In a subsequent polymer curing process, solvent inside the polymer may evaporate and polymeric coupling may be performed, and thus, the polymer may shrink. As a result, a shape of the polymer may be changed from an abrupt ⌈ shape to a gentle ∠ shape, and thus, slopes of side surfaces of the polymer may be different from each other. As an example, as illustrated in FIG. 3, a difference (see H1) may occur between a height of a first portion 170-1 of the protective layer 170 and a height of a second portion 170-2 of the protective layer 170. A whole of the first portion 170-1 may be located over the redistribution conductive layer 160 and overlap or contact the redistribution conductive layer 160. On the other hand, a part (see A) of the second portion 170-2 may overlap or contact the redistribution insulating layer 155 and the rest (see B) of the second portion 170-2 may overlap or contact the redistribution conductive layer 160. Referring again to FIGS. 1 and 3, when the redistribution pad 160P is positioned at an end of a portion extending to a left side of the redistribution conductive layer 160, the height of the first portion 170-1 located at a right side of the redistribution pad 160P, and the height of the second portion 170-2 surrounding remaining three sides of the redistribution pad 160P, except for the right side of the redistribution pad 160P, may be significantly different. Furthermore, a slope of an inclined side surface S1 of the first portion 170-1 of the protective layer 170 is greater than a slope of an inclined side surface S2 of the second portion 170-2 of the protective layer 170. Problems that may occur due to this and solutions thereof will be described in more detail with reference to other embodiments below.

The method for fabricating the semiconductor device described above will be briefly described below.

First, the lower structure US may be formed by repeating a process of depositing a conductive layer or an insulating layer over the semiconductor substrate 100 and patterning the conductive layer or the insulating layer by a mask and etching process. A final process of forming the lower structure US may be a process of forming an uppermost conductive pattern, for example, the second pad 140 and forming an insulating layer covering the uppermost conductive pattern, for example, a fifth interlayer insulating layer 145.

Subsequently, the redistribution insulating layer 155 covering the lower structure US may be deposited.

Subsequently, the redistribution insulating layer 155 and the fifth interlayer insulating layer 145 may be selectively etched to form a contact hole exposing an upper surface of the second pad 140, and then the contact hole may be filled with a conductive material. As a result, the third contact 150 may be formed.

Subsequently, a conductive material may be deposited over the redistribution insulating layer 155 in which the third contact 150 is formed and selectively etched to form the redistribution conductive layer 160.

Subsequently, the protective layer 170 may be formed over the redistribution insulating layer 155 and the redistribution conductive layer 160. The protective layer 170 may have an opening to expose the redistribution pad 160P. The protective layer 170 may be formed by a coating method.

The above processes, from the process of forming the lower structure US over the semiconductor substrate 100 to the process of forming the protective layer 170, may be performed in a front-end process.

The semiconductor device described above and its fabricating method have the following advantages.

First, because a relatively thick redistribution insulating layer and a relatively thick redistribution conductive layer are formed directly over a lower structure, it may be possible to prevent penetration of moisture into the lower structure, even if the lower structure includes a low-k material vulnerable to the moisture and a metal, for example, copper, that is easily ionized by the moisture and moves easily. As a result, reliability of the semiconductor device may be secured.

In addition, by connecting pads to which the same power is applied to each other using the redistribution conductive layer, effective power supply may be possible. As a result, the operating characteristics of the semiconductor device may be improved.

Meanwhile, as described above, according to the semiconductor device according to present embodiment, the height of the protective layer 170 may have variations, and the inclination of the side surface of the protective layer 170, adjacent to the redistribution pad 160P, may have variations. In this case, a problem may occur in a process of forming a connection terminal described in FIG. 4 below.

Figure 4:
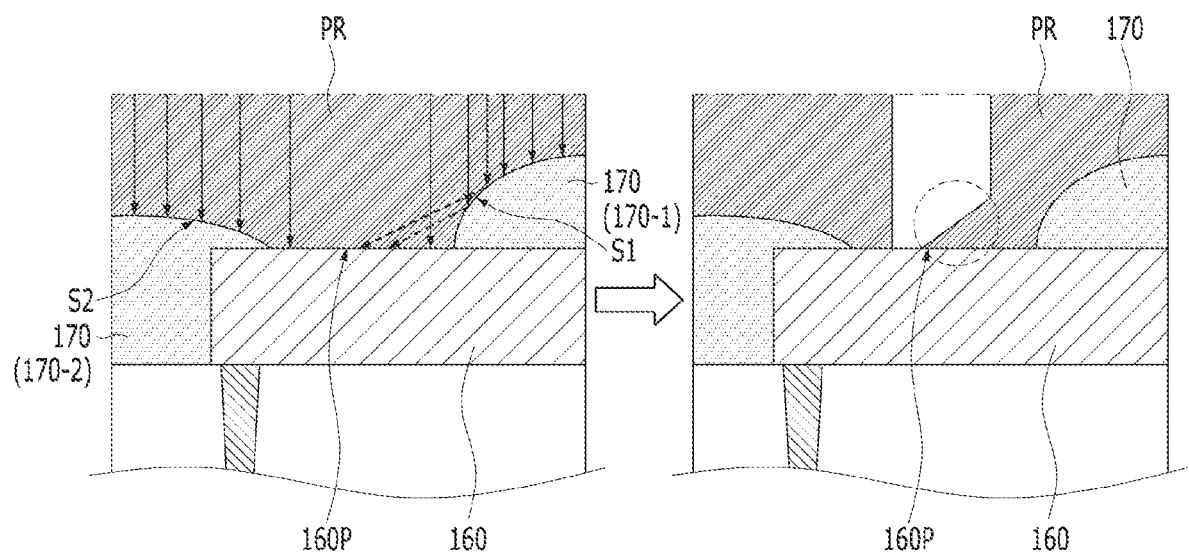
FIG. 4 is a view illustrating a part of a process for forming a connection terminal to be connected to a semiconductor device according to an embodiment of the present disclosure.

FIG. 4 is a view illustrating a part of a process for forming a connection terminal to be connected to a semiconductor device according to an embodiment of the present disclosure. Based on FIG. 3, a part of a subsequent process of forming the connection terminal will be described.

First, briefly describing the process of forming the connection terminal, a photoresist PR may be coated over the semiconductor device of FIG. 3, that is, over the redistribution pad 160P and the protective layer 170. Subsequently, the photoresist PR over the redistribution pad 160P may be removed through an exposure process. As a result, the photoresist PR may be patterned to expose the redistribution pad 160P. Subsequently, the connection terminal (not shown) such as a bump may be formed by electroplating over the exposed redistribution pad 160P.

However, referring to the left side of FIG. 4, in the process of exposing the photoresist PR, light incident to the first portion 170-1, which has the inclined side surface S1 having a large slope, may be partially reflected, and thus, the exposure may also be performed on the photoresist PR over the redistribution pad 160P. As a result, referring to the right side of FIG. 4, the photoresist PR may remain over the redistribution pad 160P even after development (see dotted circle). In this case, the subsequent electroplating process may be difficult to proceed normally. As a result, formation of the connection terminal may be difficult.

Hereinafter, an embodiment capable of addressing problems occurring in the above semiconductor device and the fabricating method thereof will be proposed.

Figure 5:
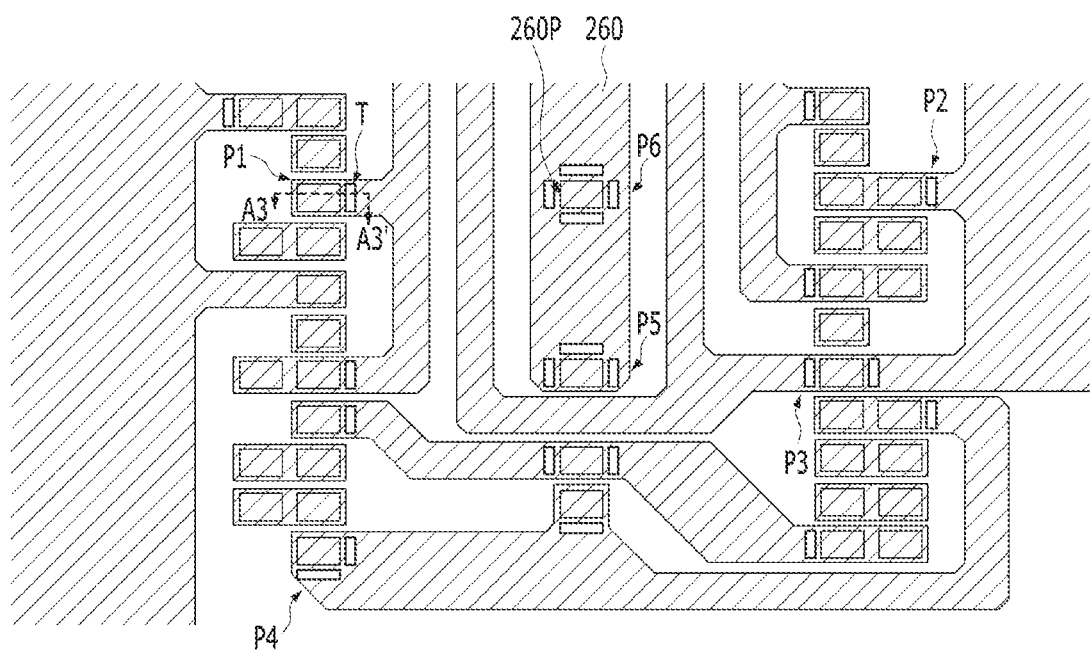
FIG. 5 is a plan view illustrating a redistribution conductive layer of a semiconductor device according to another embodiment of the present disclosure.
Figure 6:
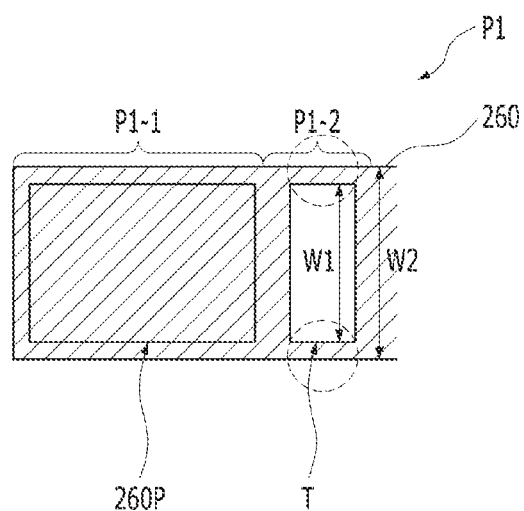
FIG. 6 is an enlarged plan view of a portion taken along a line A3-A3' of FIG. 5 and its periphery.
Figure 7:
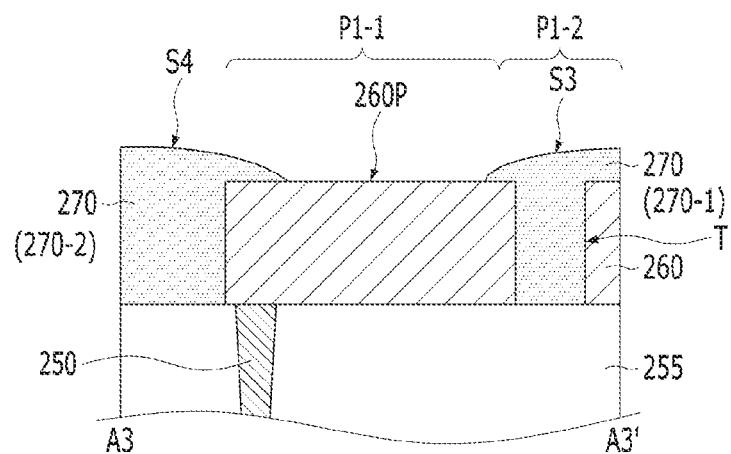
FIG. 7 is a cross-sectional view taken along the line A3-A3' of FIG. 5.

FIGS. 5 to 7 are views illustrating a semiconductor device according to another embodiment of the present disclosure, and a method for fabricating the same. Specifically, FIG. 5 is a plan view illustrating a redistribution conductive layer of a semiconductor device according to another embodiment of the present disclosure. FIG. 6 is an enlarged plan view of a portion taken along a line A3-A3' of FIG. 5 and its periphery. FIG. 7 is a cross-sectional view taken along the line A3-A3' of FIG. 5. For the parts substantially the same as the above-described embodiment, detailed description thereof will be omitted.

Referring to FIGS. 5 to 7, the semiconductor device of the present embodiment may include a redistribution insulating layer 255, a redistribution conductive layer 260 formed over the redistribution insulating layer 255, and a protective layer 270 covering the redistribution insulating layer 255 and the redistribution conductive layer 260 while having an opening to expose a portion of the redistribution conductive layer 260. The opening of the protective layer 270 may define a redistribution pad 260P of the redistribution conductive layer 260. The redistribution insulating layer 255 may be disposed over a lower structure (not shown) that is substantially the same as the lower structure (see US of FIGS. 2 and 3) of the above-described embodiment. The redistribution conductive layer 260 may be electrically connected to the lower structure through a contact 250 penetrating through the redistribution insulating layer 255.

The arrangement of the redistribution pads 260P may be substantially the same as the arrangement of the redistribution pads (see 160P of FIG. 1) of the above-described embodiment. In addition, the outline and arrangement of the redistribution conductive layer 260 may be substantially the same as the outline and arrangement of the redistribution conductive layer (see 160 of FIG. 1) of the above-described embodiment. However, in the present embodiment, a trench T may be further formed in the redistribution conductive layer 260. The trench T may be formed adjacent to the redistribution pad 260P. In particular, the redistribution conductive layer 260 may include a pad portion including the redistribution pad 260P, and an extension portion adjacent to the pad portion and extending in at least one direction from the pad portion. In this case, the trench T may be disposed in the extension portion. The location of the trench T will be described in more detail below.

As an example, referring to a portion along the line A3-A3' of FIGS. 5 and 6, that is, a portion indicated by P1, the redistribution conductive layer 260 may include a pad portion P1-1 and an extension portion P1-2. The pad portion P1-1 may overlap the redistribution pad 260P having four sides, for example, upper, lower, right, and left sides. The extension portion P1-2 may extend from the pad portion P1-1 to a right side. A planar area of the pad portion P1-1 of the redistribution conductive layer 260 may be slightly larger than a planar area of the redistribution pad 260P. Accordingly, a planar area of a remaining portion of the pad portion P1-1, except for an overlapping portion with the redistribution pad 260P, may be relatively small. This may mean that an overlapping area between the protective layer 270 and the pad portion P1-1 is relatively small in a plan view. Therefore, as shown in FIG. 7, a second portion 270-2 of the protective layer 270 may have a small overlapping area with the pad portion P1-1 and most of the second portion 270-2 may be located over the redistribution insulating layer 255. Therefore, a height of the second portion 270-2 may be low and a slope of an inclined side surface S4 of the second portion 270-2 may be gentle. For reference, the second portion 270-2 of the protective layer 270 may mean a portion which partially overlaps the pad portion P1-1, while not overlapping the extension portion P1-2. On the other hand, because the trench T exists in the extension portion P1-2, a planar area of the extension portion P1-2 may be relatively small. This may mean that an overlapping area between the protective layer 270 and the extension portion P1-2 is relatively small in a plan view. Therefore, as shown in FIG. 7, a first portion 270-1 of the protective layer 270 may have a small overlapping area with the extension portion P1-2 and most of the first portion 270-1 may be filled in the trench T. Therefore, a height of the first portion 270-1 may be low and a slope of an inclined side surface S3 of the first portion 270-1 may be gentle.

A depth of the trench T may be substantially the same as a thickness of the redistribution conductive layer 260. In this case, in the cross-section of FIG. 7, it appears that the pad portion P1-1 and the extension portion P1-2 of the redistribution conductive layer 260 are separated by the trench T. However, in order to transmit signals and power through the redistribution conductive layer 260, the redistribution conductive layer 260 must not be substantially separated. Therefore, in a plan view, a width of the trench T may be controlled to prevent electrical/physical separation of the pad portion P1-1 and the extension portion P1-2. That is, as shown in the plan view of FIG. 6, in a direction perpendicular to an extending direction of the redistribution conductive layer 260, that is, in a vertical direction, a width W1 of the trench T may be smaller than a width W2 of the extension portion P1-2. Furthermore, in the present embodiment, side surfaces of the trench T may be surrounded by the extension portion P1-2. In this case, parts (see dotted circles) of the extension portion P1-2 located at both sides of the trench T in the vertical direction may serve to connect the pad portion P1-1 and the extension portion P1-2.

As another example, referring to a portion indicated by P2, two redistribution pads 260P may be arranged adjacent to each other in a horizontal direction. In this case, the redistribution conductive layer 260 may include a pad portion overlapping the two redistribution pads 260P and an extension portion extending from the pad portion to a right side. The trench T may be disposed in the extension portion, that is, at a right side of the redistribution pad 260P. Because the two redistribution pads 260P are arranged adjacent to each other, the trench T need not be disposed between the two redistribution pads 260P. However, if a space between the two redistribution pads 260P increases so that a planar area of the redistribution conductive layer 260 between the two redistribution pads 260P increases, the trench T may be further formed between the two redistribution pads 260P. That is, an area between the two redistribution pads 260P may be determined as an extension portion.

As another example, referring to a portion indicated by P3, the redistribution conductive layer 260 may include a pad portion overlapping the redistribution pad 260P, and extension portions extending from the pad portion to left and right sides, respectively. The trenches T may be disposed in the extension portions, respectively. That is, the trenches T may be disposed at left and right sides of redistribution pad 260P, respectively.

As another example, referring to a portion indicated by P4, the redistribution conductive layer 260 may include a pad portion overlapping the redistribution pad 260P, and extension portions extending from the pad portion to right and lower sides, respectively. In the present embodiment, two trenches T may be disposed separately from each other in the extension portions, respectively. That is, the two trenches T may be disposed at right and lower sides of the redistribution pads 260P, respectively. However, a lower portion of a right one of the two trenches T and a right portion of a lower one of the two trenches T may be connected to each other to form a single trench.

As another example, referring to a portion indicated by P5, the redistribution conductive layer 260 may include a pad portion overlapping the redistribution pad 260P, and extension portions extending from the pad portion to left, right, and upper sides, respectively. In the present embodiment, three trenches T may be disposed separately from each other in the extension portions, respectively. That is, the three trenches T may be disposed at left, right, and upper sides of the redistribution pad 260P, respectively. However, at least two of the three trenches T may be connected to each other.

As another example, referring to a portion indicated by P6, the redistribution conductive layer 260 may include a pad portion overlapping the redistribution pad 260P, and extension portions extending from the pad portion to left, right, upper, and lower sides, respectively. In the present embodiment, four trenches T may be disposed separately from each other in the extension portions, respectively. That is, the four trenches T may be disposed at left, right, upper, and lower sides of the redistribution pad 260P, respectively. At least two of the four trenches T may be connected to each other. However, all four trenches T are not connected. This is because when all four trenches T are connected to form a single trench, the pad portion and the extension portion of the redistribution conductive layer 260 are separated from each other. In other words, if the redistribution pad 260P is completely surrounded by a trench having a closed curve shape or a closed polygonal shape, the redistribution pad 260P may be separated from the redistribution conductive layer 260.

In the present embodiment, one trench T may be disposed in one extension portion. Also, the trench T may have a planar rectangular shape. However, the present disclosure is not limited thereto, and the number of the trenches T disposed in the extension portion may be two or more. In addition, the planar shape of the trench T may be variously modified. For example, the planar shape of the trench T may be a circular shape, an oval shape, a slit shape, or the like.

According to the present embodiment, the step height of the protective layer 270 may be reduced and/or removed by the trench T. Also, the slopes of the side surfaces of the protective layer 270, around the redistribution pad 260P, may be the same and/or similar while being relatively gentle. As a result, the problem occurring during the process of forming the connection terminal in the above-described embodiment, that is, the problem that the photoresist remains on the redistribution pad by the light reflected on the inclined surface in the exposure process, can be addressed. In addition, the advantages of the above-described embodiment, may be obtained. That is, it may be possible to secure the reliability of the semiconductor device and improve the operating characteristics.

The semiconductor device of the present embodiment may be fabricated by a method which is substantially the same as the fabricating method of the semiconductor device of the above-described embodiment, except for forming the redistribution conductive layer.

In the present embodiment, the redistribution conductive layer 260 having the trench T may be formed as follows.

As an example, the redistribution conductive layer 260 may be formed by depositing a conductive material over the redistribution insulating layer 255, and selectively etching the conductive material. At this time, the selective etching may be performed by using a mask that covers an area defined by the outline of the redistribution conductive layer 260 and opens an area where the trench T is to be formed.

Alternatively, as another example, a redistribution conductive layer, which has the same outline as the redistribution conductive layer 160 of FIG. 1, may be formed by depositing a conductive material over the redistribution insulating layer 255 and selectively etching the conductive material. And then, the redistribution conductive layer may be additionally etched using a mask that opens an area where the trench T is to be formed.

Figure 8:
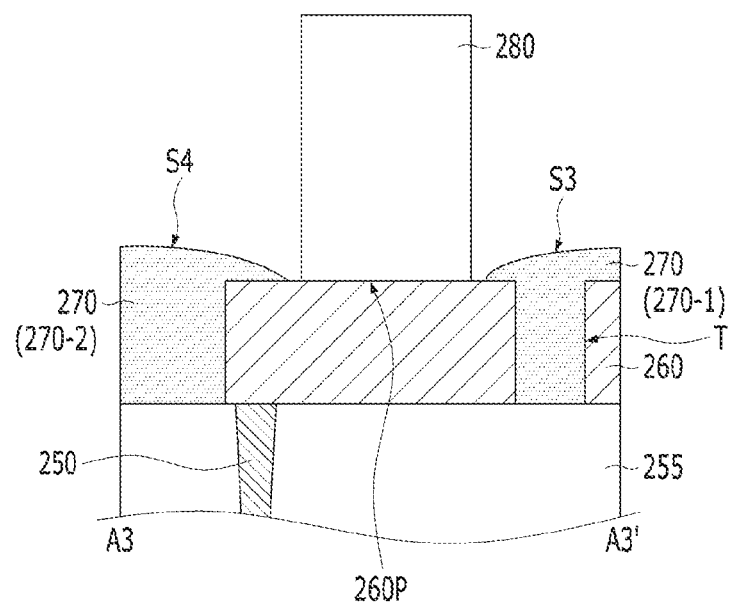
FIG. 8 is a view illustrating a state in which a connection terminal is further formed in a semiconductor device according to another embodiment of the present disclosure.

FIG. 8 is a view illustrating a state in which a connection terminal is further formed in a semiconductor device according to another embodiment of the present disclosure.

Referring to FIG. 8, the semiconductor device of the present embodiment may further include a connection terminal 280 in addition to the components of the semiconductor device of FIGS. 5 to 7 described above.

The connection terminal 280 may be formed to connect to each of the redistribution pads 260P. As shown in FIG. 5, when a plurality of redistribution pads 260P are arranged, the connection terminals 280 may connect to at least some of the redistribution pads 260P. The semiconductor device may be electrically connected to an external device (not shown) through the connection terminal 280, and may receive signals, power, or the like.

The connection terminal 280 may be formed by coating a photoresist over the redistribution pad 260P and the protective layer 270, patterning the photoresist so that the surface of the redistribution pad 260P is exposed by an exposure process, and performing an electroplating process. In the present embodiment, because the height of the protective layer 270 around the redistribution pad 260P is low and the slopes of the side surfaces thereof are gentle, the light reflected on the inclined side surface during the exposure process may be less, and thus, the patterning of the photoresist may be easy. As a result, connection terminal 280 may be easily formed.

In the present embodiment, the connection terminal 280 may have a columnar bump shape. However, the present disclosure is not limited thereto, and various types of connectors, such as solder balls or bonding wires may be used as the connection terminal 280.

Figure 9:
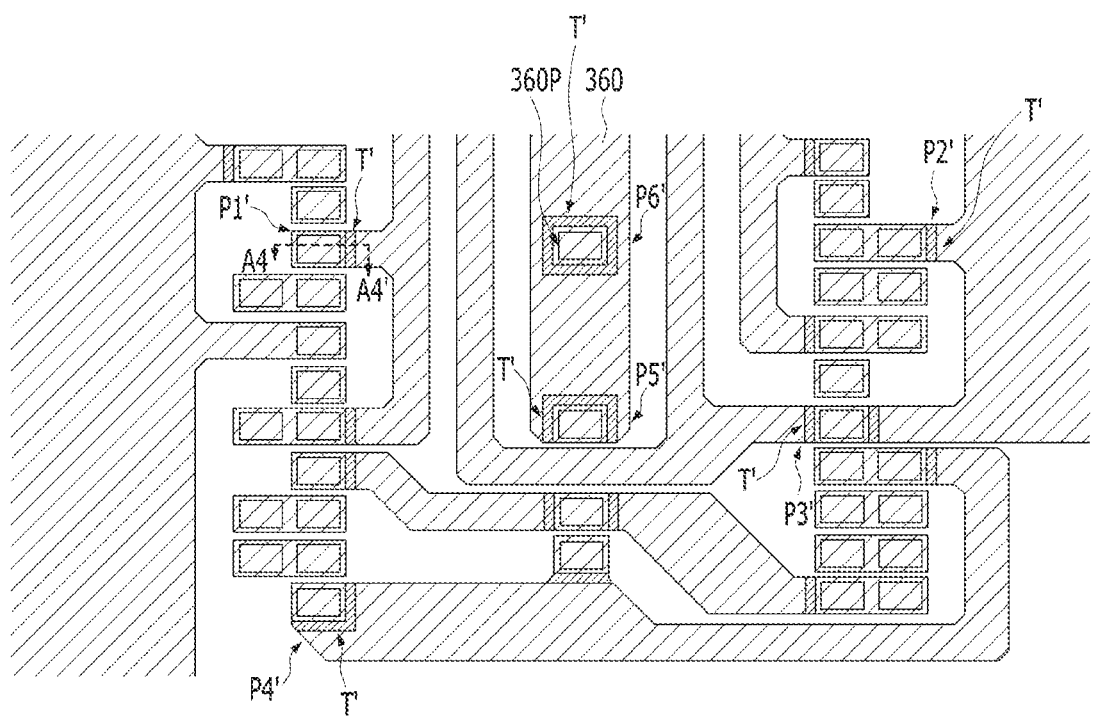
FIG. 9 is a plan view illustrating a redistribution conductive layer of a semiconductor device according to another embodiment of the present disclosure.
Figure 10:
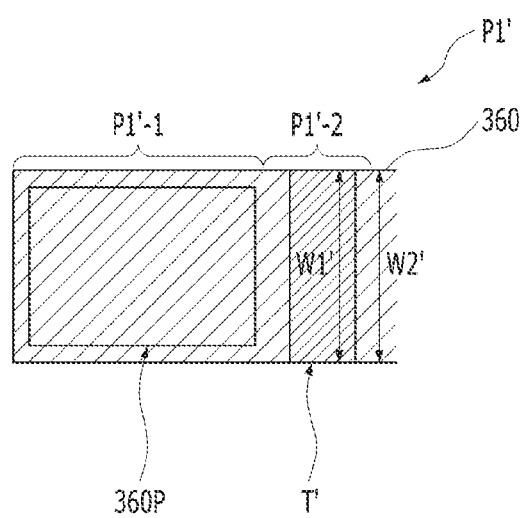
FIG. 10 is an enlarged plan view of a portion taken along a line A4-A4' of FIG. 9 and its periphery.
Figure 11:
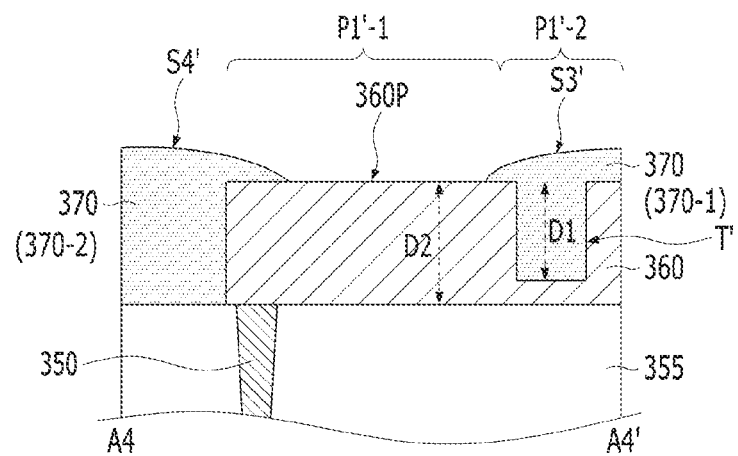
FIG. 11 is a cross-sectional view taken along the line A4-A4' of FIG. 9.

FIGS. 9 to 11 are views illustrating a semiconductor device according to another embodiment of the present disclosure and a method for fabricating the same. Specifically, FIG. 9 is a plan view illustrating a redistribution conductive layer of a semiconductor device according to another embodiment of the present disclosure. FIG. 10 is an enlarged plan view of a portion taken along a line A4-A4' of FIG. 9 and its periphery. FIG. 11 is a cross-sectional view taken along the line A4-A4' of FIG. 9. For the parts substantially the same as the above-described embodiments, detailed description thereof will be omitted.

Referring to FIGS. 9 to 11, the semiconductor device of the present embodiment may include a redistribution insulating layer 355, a redistribution conductive layer 360 formed over the redistribution insulating layer 355 and including a redistribution pad 360P, and a protective layer 370 covering the redistribution insulating layer 355 and the redistribution conductive layer 360 while exposing the redistribution pad 360P. The redistribution pad 360P may be a portion of the redistribution conductive layer 360, and may be defined as a portion exposed by the protective layer 370 without being covered by the protective layer 370. The redistribution conductive layer 360 may be electrically connected to a lower structure (not shown) through a contact 350 penetrating the redistribution insulating layer 355.

The redistribution conductive layer 360 may include a pad portion including the redistribution pad 360P, and an extension portion adjacent to the pad portion and extending in at least one direction from the pad portion. In this case, a trench T' may be disposed in the extension portion. In the present embodiment, a depth of the trench T' may be smaller than a thickness of the redistribution conductive layer 360, and accordingly, there may be no restriction on a width of the trench T'. This will be described in detail below.

As an example, referring to a portion along the line A4-A4' of FIG. 9 and FIG. 10, that is, a portion indicated by P1', the redistribution conductive layer 360 may include a pad portion P1'-1 and an extension portion P1'-2. The pad portion P1'-1 may overlap the redistribution pad 360P, which has four sides, for example, upper, lower, right and left sides. The extension portion P1'-2 may extend from the pad portion P1'-1 to a right side. The trench T' may be disposed in the extension portion P1'-2. A planar area of the pad portion P1'-1 may be slightly larger than a planar area of the redistribution pad 360P. Accordingly, an overlapping area of the protective layer 370 and the pad portion P1'-1 may be relatively small in a plan view. In addition, because the trench T' is present in the extension portion P1'-2, an overlapping area of the protective layer 370 and the extension portion P1'-2 may be relatively small in a plan view. Accordingly, as shown in FIG. 11, a second portion 370-2 of the protective layer 370 may have a small overlapping area with the pad portion P1'-1, and most of the second portion 370-2 may be disposed over the redistribution insulating layer 355. As a result, a height of the second portion 370-2 of the protective layer 370 may be low and a slope of an inclined side surface S4' thereof may be gentle. In addition, because the first portion 370-1 of the protective layer 370 has a small overlapping area with the extension portion P1'-2 and most of the first portion 370-1 is filled in the trench T', a height of the first portion 370-1 of the protective layer 370 may be low and a slope of an inclined side surface S3' thereof may be gentle.

Here, a depth D1 of the trench T' may be smaller than a thickness D2 of the redistribution conductive layer 360. That is, the redistribution conductive layer 360 may remain in a predetermined thickness under the trench T'. For this reason, regardless of a planar shape of the trench T', the pad portion P1'-1 and the extension portion P1'-2 may be electrically and physically connected to each other. For example, as shown in the plan view of FIG. 10, in a direction perpendicular to an extending direction of the redistribution conductive layer 360, for example, in a vertical direction, a width W1' of the trench T' may be the same as a width W2' of the extension portion P1'-2. In this case, in a plan view, it may appear that the pad portion P1'-1 and the extension portion P1'-2 are separated from each other. However, the pad portion P1'-1 and the extension portion P1'-2 may be connected to each other through the remaining portion of the redistribution conductive layer 360 under the trench T'.

As another example, referring to a portion indicated by P2', two redistribution pads 360P may be arranged adjacent to each other in a horizontal direction. In this case, the redistribution conductive layer 360 may include a pad portion overlapping the two redistribution pads 360P, and an extension portion extending from the pad portion to a right side. The trench T' may be disposed in the extension portion, that is, at a right side of the redistribution pad 360P. In a plan view, in the direction perpendicular to the extending direction of the redistribution conductive layer 360, that is, in the vertical direction, a width of the trench T' may be the same as a width of the extension portion. Accordingly, in a plan view, it may appear that the the redistribution pad 360P is separated from the redistribution conductive layer 360 by the trench T'. However, because the depth of the trench T' is smaller than the thickness of the redistribution conductive layer 360, the redistribution pad 360P might not actually be separated from the redistribution conductive layer 360.

As another example, referring to a portion indicated by P3', the redistribution conductive layer 360 may include a pad portion overlapping the redistribution pad 360P, and extension portions extending from the pad portion to left and right sides, respectively. The trenches T' may be disposed in the extension portions, respectively. That is, the trenches T' may be disposed at left and right sides of redistribution pad 360P, respectively. Similar to the P1' portion, the width of the trench T' may be the same as the width of the extension portion, while the depth of the trench T' may be smaller than the thickness of the redistribution conductive layer 360. Therefore, the redistribution pad 360P might not be separated from the redistribution conductive layer 360.

As another example, referring to a portion indicated by P4', the redistribution conductive layer 360 may include a pad portion overlapping the redistribution pad 360P, and extension portions extending from the pad portion to right and lower sides, respectively. In the present embodiment, the trench T' may be disposed in the extension portions to have a shape that completely surrounds the redistribution pad 360P. That is, the trench T' may have a ⌋ shape corresponding to the right and lower sides of the redistribution pad 360P. In this case, it may appear that the redistribution pad 360P is separated from the redistribution conductive layer 360 by the trench T'. However, because the depth of the trench T' is smaller than the thickness of the redistribution conductive layer 360, the redistribution pad 360P might not be separated from the redistribution conductive layer 360.

As another example, referring to a portion indicated by P5', the redistribution conductive layer 360 may include a pad portion overlapping the redistribution pad 360P, and extension portions extending from the pad portion to left, right, and upper sides, respectively. In the present embodiment, the trench T' may be disposed in the extension portions to have a shape that completely surrounds the redistribution pad 360P. That is, the trench T' may have a $a_n$ shape corresponding to the left, right, and upper sides of the redistribution pad 360P. Similar to the P4' portion, because the depth of the trench T' is smaller than the thickness of the redistribution conductive layer 360, the redistribution pad 360P might not be separated from the redistribution conductive layer 360.

As another example, referring to a portion indicated by P6', the redistribution conductive layer 360 may include a pad portion overlapping the redistribution pad 360P, and extension portions extending from the pad portion to left, right, upper, and lower sides, respectively. In the present embodiment, the trench T' may be disposed in the extension portions to have a shape that completely surrounds the redistribution pad 360P. That is, the trench T' may have a □ shape corresponding to the left, right, upper and lower sides of the redistribution pad 360P. Similar to the P4' portion, because the depth of the trench T' is smaller than the thickness of the redistribution conductive layer 360, the redistribution pad 360P might not be separated from the redistribution conductive layer 360.

In the present embodiment, the step height of the protective layer 370 may be reduced and/or removed by the trench T', and the slopes of the side surfaces of the protective layer 370, around the redistribution pad 360P, may be the same and/or similar while being relatively gentle. As a result, the advantages of the above-described embodiments may be obtained. That is, the reliability of the semiconductor device may be secured, and the operating characteristics may be improved.

The semiconductor device of the present embodiment may be fabricated by a method which is substantially the same as the fabricating method of the semiconductor device of the above-described embodiments, except for forming the redistribution conductive layer.

In the present embodiment, the redistribution conductive layer 360 having the trench T' may be formed as follows.

As an example, a redistribution conductive layer, which has the same outline as the redistribution conductive layer 160 of FIG. 1, may be formed by depositing a conductive material over the redistribution insulating layer 355 and selectively etching the conductive material. And then, the redistribution conductive layer may be additionally etched using a mask that opens an area where the trench T is to be formed. At this time, the etching depth may be adjusted to form the trench T' having the depth smaller than the thickness of the redistribution conductive layer.

Figure 12:
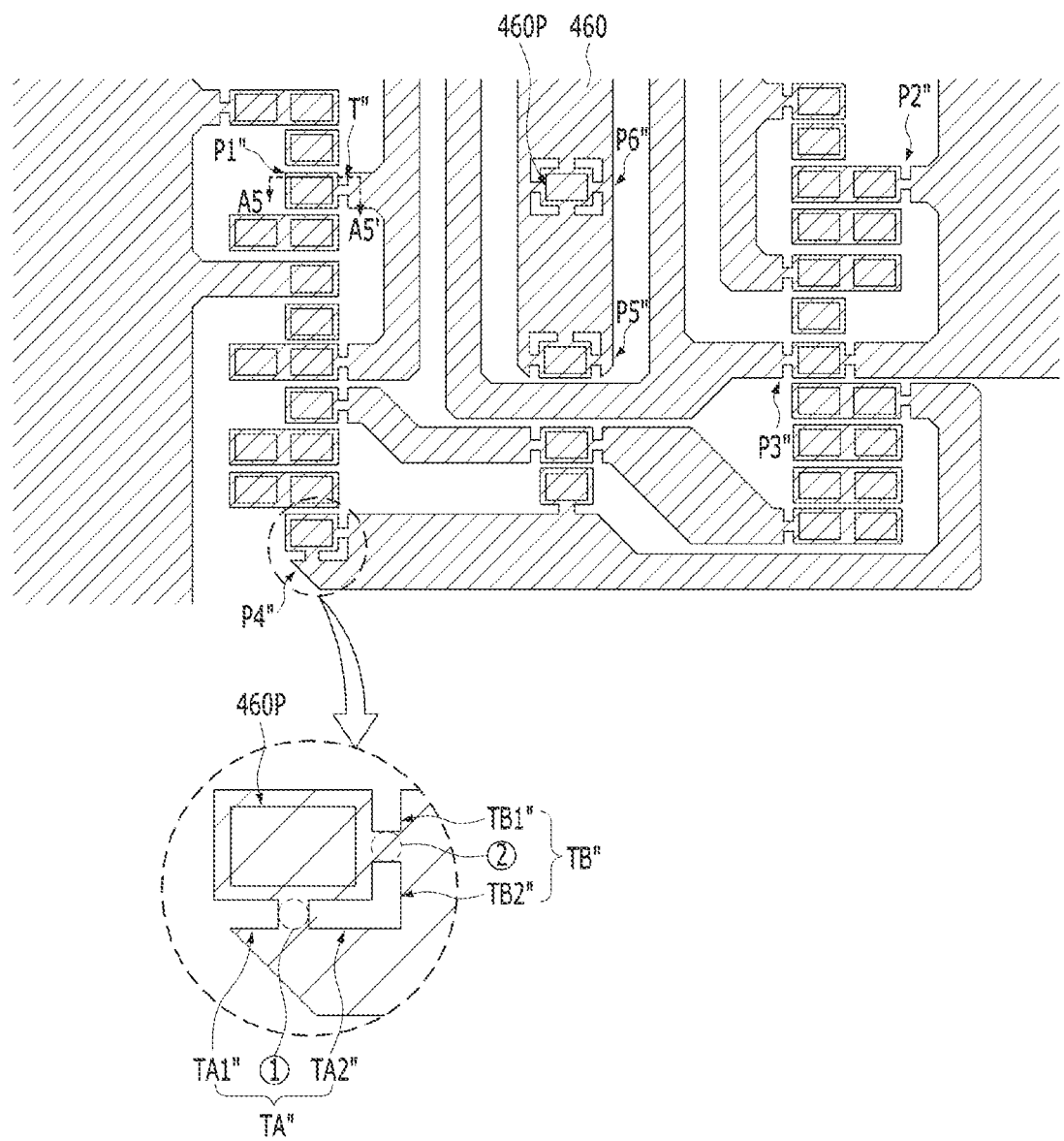
FIG. 12 is a plan view illustrating a redistribution conductive layer of a semiconductor device according to another embodiment of the present disclosure.
Figure 13:
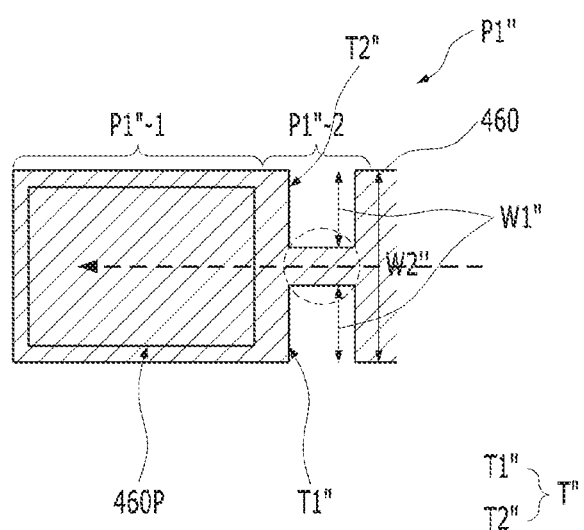
FIG. 13 is an enlarged plan view of a portion taken along a line A5-A5' of FIG. 12 and its periphery.
Figure 14:
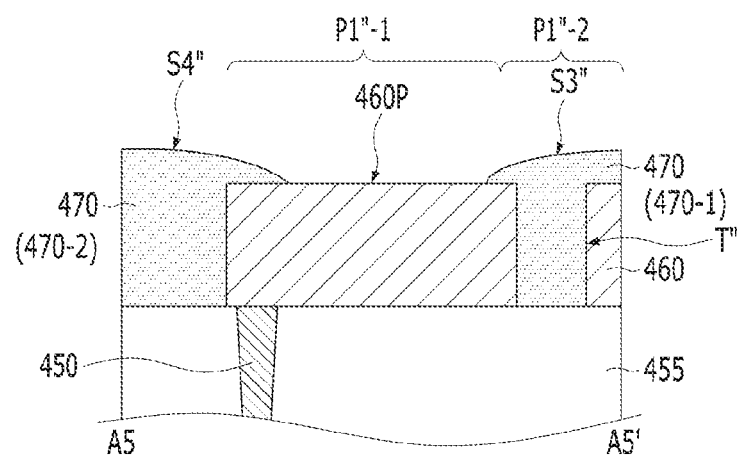
FIG. 14 is a cross-sectional view taken along the line A5-A5' of FIG. 12.

FIGS. 12 to 14 are views illustrating a semiconductor device according to another embodiment of the present disclosure, and a method for fabricating the same. Specifically, FIG. 12 is a plan view illustrating a redistribution conductive layer of a semiconductor device according to another embodiment of the present disclosure. FIG. 13 is an enlarged plan view of a portion taken along a line A5-A5' of FIG. 12 and its periphery. FIG. 14 is a cross-sectional view taken along the line A5-A5' of FIG. 12. For the parts substantially the same as the above-described embodiments, detailed description thereof will be omitted.

Referring to FIGS. 12 to 14, the semiconductor device of the present embodiment may include a redistribution insulating layer 455, a redistribution conductive layer 460 formed over the redistribution insulating layer 455 and including a redistribution pad 460P, and a protective layer 470 covering the redistribution insulating layer 455 and the redistribution conductive layer 460 while exposing the redistribution pad 460P.

The redistribution conductive layer 460 may include a pad portion including the redistribution pad 460P, and an extension portion adjacent to the pad portion and extending in at least one direction from the pad portion. A trench T" may be formed in the extension portion of the redistribution conductive layer 460. The location of the trench T" will be described in more detail below.

As an example, referring to a portion along the line A5-A5' of FIGS. 12 and 13, that is, a portion indicated by P1", the redistribution conductive layer 460 may include a pad portion P1"-1 and an extension portion P1"-2. The pad portion P1"-1 may overlap the redistribution pad 460P, which has four sides, for example, upper, lower, right and left sides. The extension portion P1"-2 may extend from the pad portion P1"-1 to a right side. The trench T" may be disposed in the extension portion P1"-2. A planar area of the pad portion P1"-1 may be slightly larger than a planar area of the redistribution pad 460P. Accordingly, an overlapping area of the protective layer 470 and the pad portion P1"-1 may be relatively small in a plan view. In addition, because the trench T" is present in the extension portion P1"-2, an overlapping area of the protective layer 470 and the extension portion P1"-2 may be relatively small in a plan view. Accordingly, as shown in FIG. 14, a second portion 470-2 of the protective layer 470 may have a small overlapping area with the pad portion P1"-1, and most of the second portion 470-2 may be located over the redistribution insulating layer 455. As a result, a height of the second portion 470-2 of the protective layer 470 may be low and a slope of an inclined side surface S4" thereof may be gentle. In addition, a first portion 470-1 of the protective layer 470 may have a small overlapping area with the extension portion P1"-2, and most of the first portion 470-1 may be filled in the trench T". As a result, a height of the first portion 470-1 of the protective layer 470 may be low and a slope of an inclined side surface S3" thereof may be gentle.

Here, the trench T" may include a first trench T1" and a second trench T2" positioned at both sides in a direction perpendicular to an extending direction of the redistribution conductive layer 460, for example, in a vertical direction, in a plan view. However, because a width W1" of the trench T" is smaller than a width W2" of the extension portion P1"-2, there may be a portion (see dotted circles) of the extension portion P1"-2 between the first trench T1" and the second trench T2" to serve to connect the pad portion P1"-1 and the extension portion P1"-2. That is, even if a depth of the trench T" is the same as the thickness of the redistribution conductive layer 460, the electrical and physical connection of the pad portion P1"-1 and the extension portion P1"-2 may be maintained.

Particularly, the portion of the extension portion P1"-2 indicated by dotted circles may be centrally located in the vertical direction. In other words, a width of the first trench T1" and a width of the second trench T2" may be the same in the vertical direction. As in the present embodiment, when the pad portion P1"-1 and the extension portion P1"-2 are connected to each other in the center, electrical signal path (see a dotted arrow) through the redistribution conductive layer 460 may have the shortest distance. Therefore, the speed and efficiency of signal transmission may be increased.

As another example, referring to a portion indicated by P2", two redistribution pads 460P may be arranged adjacent to each other in a horizontal direction. In this case, the redistribution conductive layer 460 may include a pad portion overlapping the two redistribution pads, and an extension portion extending from the pad portion to a right side. The trench T" may be disposed in the extension portion, that is, at a right side of the redistribution pad 460P. Here, the trench T" may include two trenches disposed at both sides with a part of the extension portion interposed therebetween. The part of the extension portion may be disposed centrally in the vertical direction. That is, the shape of the trench T" may be substantially the same as that described in FIG. 13.

As another example, referring to a portion indicated by P3", the redistribution conductive layer 460 may include a pad portion overlapping the redistribution pad 460P, and extension portions extending from the pad portion to left and right sides, respectively. Two trenches T" may be disposed in the extension portions, respectively. That is, the two trenches T" may be disposed at left and right sides of redistribution pad 460P, respectively. Here, each of the two trenches T" may include two trenches disposed at both sides with a part of the extension portion interposed therebetween. The part of the extension portion may be disposed centrally in the vertical direction. That is, the shape of each of the two trenches T" may be substantially the same as that described in FIG. 13.

As another example, referring to a portion indicated by P4", the redistribution conductive layer 460 may include a pad portion overlapping the redistribution pad 460P, and extension portions extending from the pad portion to right and lower sides, respectively. The trenches T" may be disposed in the extension portions, respectively. That is, the trenches T" may be disposed at lower and right sides of redistribution pad 460P, respectively. For convenience of description, the P4" portion is enlarged and illustrated in FIG. 12, and referring to this, the trenches T" may include a lower trench TA" disposed at the lower side of the redistribution pad 460P, and a right trench TB" disposed at the right side of the redistribution pad 460P. Here, the lower trench TA" may be divided into two portions in a direction perpendicular to an extending direction, that is, in a horizontal direction. The two portions will be referred to as a left portion TA1" and a right portion TA2". A part of the extension portion (see ①) may be interposed between the left portion TA1" and the right portion TA2". Also, the right trench TB" may be divided into two portions in a direction perpendicular to an extending direction, that is, in the vertical direction. The two portions will be referred to as an upper portion TB1" and a lower portion TB2". A part of the extension portion (see ②) may be interposed between the upper portion TB1" and the lower portion TB2". Unlike the portions indicated by P1" to P3", the portion indicated by P4" may have two adjacent extension portions, that is, a lower extension portion and a right extension portion. In this case, adjacent ones among the portions of the trenches T" may be connected to each other. That is, the right portion TA2" of the lower trench TA" and the lower portion TB2" of the right trench TB" may be connected to each other, so as to surround a right/lower corner of the redistribution pad 460P while having a ⌋ shape. In the present embodiment, because an electrical signal is transmitted to the center of the redistribution pad 460P, the signal path may have the shortest distance.

As another example, referring to a portion indicated by P5", the redistribution conductive layer 460 may include a pad portion overlapping the redistribution pad 460P, and extension portions extending from the pad portion to left, right and upper sides, respectively. The trenches T" may be disposed in the extension portions, respectively. That is, the trenches T" may be disposed at left, lower and right sides of redistribution pad 460P, respectively. Each of the trenches T" may be divided into two portions in a direction perpendicular to an extending direction with a part of the extension portion interposed therebetween. In the portion indicated by P5", a left extension portion and an upper extension portion may be adjacent to each other, and a right extension portion and the upper extension portion may be adjacent to each other. In this case, adjacent ones among the portions of the trenches T" may be connected to each other. That is, an upper portion of the trench T" located at the left side of the redistribution pad 460P and a left portion of the trench T" located at the upper side of the redistribution pad 460P may be connected to each other, so as to surround a left/upper corner of the redistribution pad 460P while having a ⌈ shape. Also, an upper portion of the trench T" located at the right side of the redistribution pad 460P and a right portion of the trench T" located at the upper side of the redistribution pad 460P may be connected to each other, so as to surround a right/upper corner of the redistribution pad 460P while having a shape.

As another example, referring to a portion indicated by P6", the redistribution conductive layer 460 may include a pad portion overlapping the redistribution pad 460P, and extension portions extending from the pad portion to left, right, lower, and upper sides, respectively. The trenches T" may be disposed in the extension portions, respectively. That is, the trenches T" may be disposed at left, right, lower, and upper sides of redistribution pad 460P, respectively. Each of the trenches T" may be divided into two portions in a direction perpendicular to an extending direction with a part of the extension portion interposed therebetween. In the portion indicated by P6", an upper extension portion may be adjacent to left and right extension portions, and a lower extension portion may be adjacent to the left and right extension portions. In this case, adjacent ones among the portions of the trenches T" may be connected to each other. That is, an upper portion of the trench T" located at the right side of the redistribution pad 460P and a right portion of the trench T" located at the upper side of the redistribution pad 460P may be connected to each other, so as to surround a right/upper corner of the redistribution pad 460P while having a ⌉ shape. Also, a lower portion of the trench T" located at the right side of the redistribution pad 460P and a right portion of the trench T" located at the lower side of the redistribution pad 460P may be connected to each other, so as to surround a right/lower corner of the redistribution pad 460P while having a ⌋ shape. Also, a lower portion of the trench T''' located at the left side of the redistribution pad 460P and a left portion of the trench T''' located at the lower side of the redistribution pad 460P may be connected to each other, so as to surround a left/lower corner of the redistribution pad 460P while having a ⌊ shape.

Meanwhile, in the above embodiments, the case where the redistribution pad has a rectangular shape in a plan view plane has been described. However, the shape of the redistribution pad may be variously modified, such as a polygon. Accordingly, the position and shape of the trench may be variously modified. This will be described by way of example with reference to FIGS. 15A to 15C.

Figure 15A:
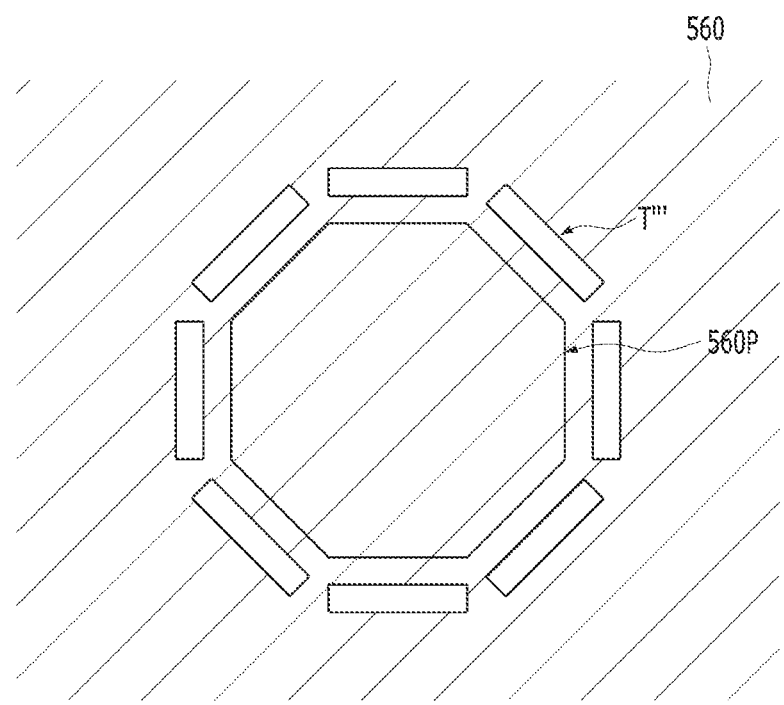
FIGS. 15A, 15B, and 15C are plan views illustrating shapes of redistribution pads and trenches according to another embodiment of the present disclosure.
Figure 15B:
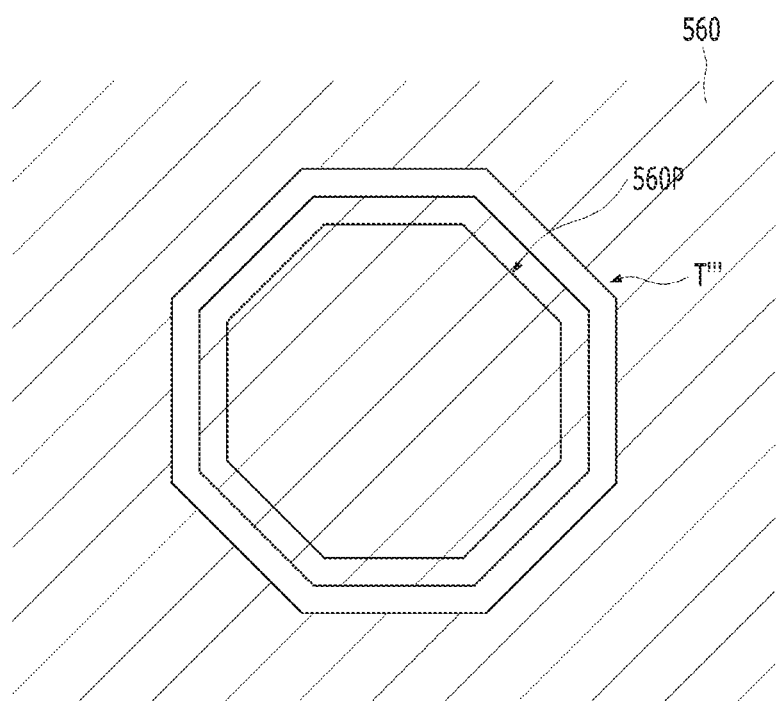
Figure 15C:
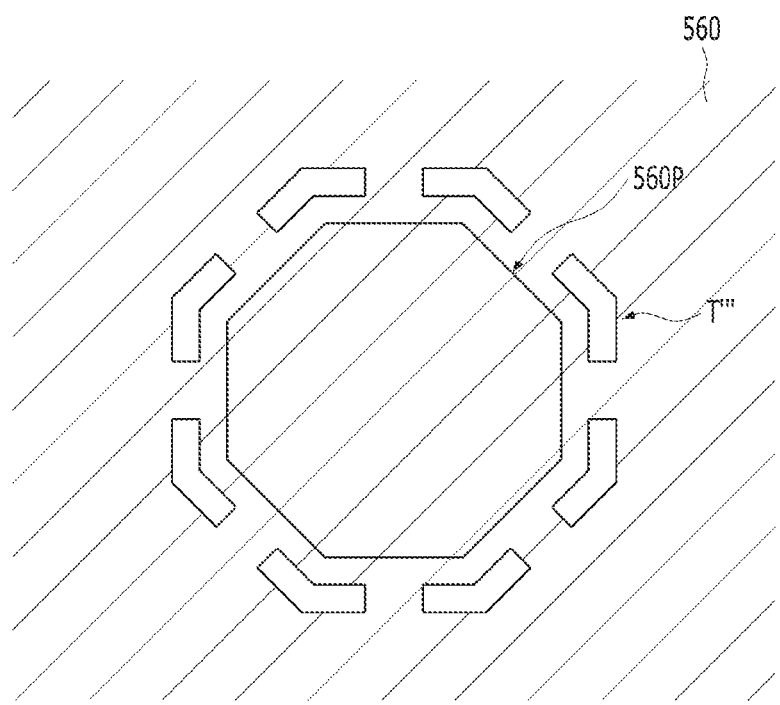

FIGS. 15A, 15B, and 15C are plan views illustrating shapes of redistribution pads and trenches according to another embodiment of the present disclosure. In the present embodiment, in a plan view, a redistribution pad 560P may have an octagonal shape having first to eighth sides. In addition, an extension portion of a redistribution conductive layer 560 may surround the redistribution pad 560P.

Referring to FIG. 15A, trenches T''' may be disposed to correspond to the first to eighth sides of the redistribution pad 560P, respectively. The trenches T''' may be separated from each other. Alternatively, at least two of the trenches T''' may be connected to each other. However, if a depth of the trench T''' is the same as a thickness of the redistribution conductive layer 560, all of the trenches T''' cannot be connected.

Referring to FIG. 15B, the trench T''' may have a shape surrounding the entire side surfaces of the redistribution pad 560P. In this case, in order to connect the redistribution pad 560P and the redistribution conductive layer 560, a depth of the trench T''' may be smaller than a thickness of the redistribution conductive layer 560.

Referring to FIG. 15C, the trench T''' may be disposed to surround each of eight corners of the redistribution pad 560P. A portion of the redistribution conductive layer 560 may exist between adjacent trenches T''' to be connected to the redistribution pad 560P. The portion of the redistribution conductive layer 560 between the adjacent trenches T''' may correspond to a center of the redistribution pad 560P. This is to make an electrical signal path from the redistribution conductive layer 560 to the redistribution pad 560P have the shortest distance.

However, unlike the embodiments of FIGS. 15A to 15C, the extension portion of the redistribution conductive layer 560 may be extended from some of the first to eighth sides of the redistribution pad 560P. In this case, the trench T''' might be disposed only in the extension portion.

Figure 16:
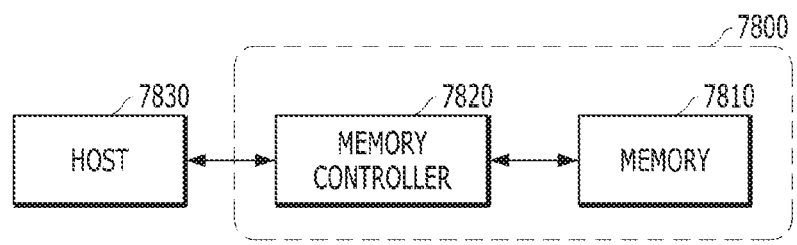
FIG. 16 shows a block diagram illustrating an electronic system employing a memory card including a semiconductor package, according to an embodiment.

FIG. 16 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 17:
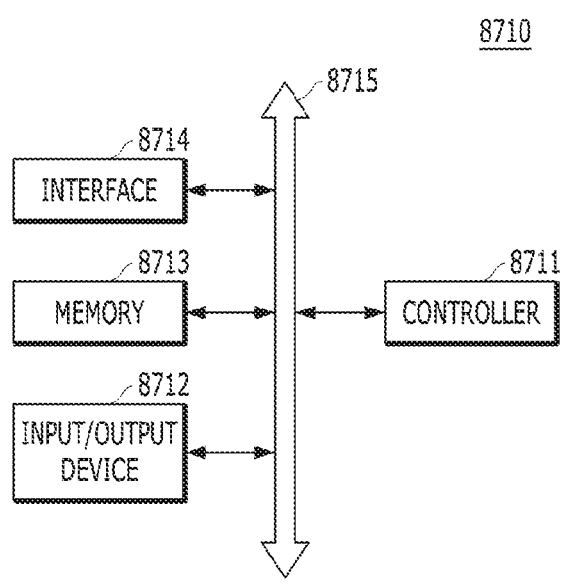
FIG. 17 shows a block diagram illustrating another electronic system including a semiconductor package, according to an embodiment.

FIG. 17 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wi bro (wireless broadband Internet).

Although various embodiments have been described for illustrative purposes, it will be apparent to those skilled in the art that various changes and modifications may be made without departing from the spirit and scope of the disclosure as defined in the following claims.

What is claimed is:
1. A semiconductor device, comprising:
a lower structure;
a redistribution insulating layer disposed over the lower structure;
a redistribution conductive layer disposed over the redistribution insulating layer and electrically connected to a part of the lower structure, the redistribution conductive layer including a redistribution pad; and
a protective layer covering the redistribution insulating layer and the redistribution conductive layer while leaving the redistribution pad exposed,
wherein the redistribution conductive layer includes a trench disposed adjacent to the redistribution pad,
wherein a part of the protective layer fills the trench, wherein the redistribution conductive layer includes a pad portion including the redistribution pad and an extension portion extending in at least one direction from the pad portion,
wherein the trench is disposed in the extension portion, and
wherein the pad portion and the extension portion are physically and electrically connected to each other.

2. The semiconductor device of claim 1, wherein a depth of the trench is the same as a thickness of the redistribution conductive layer.

3. The semiconductor device of claim 2, wherein, in a plan view, in a direction perpendicular to an extending direction of the extension portion, a width of the trench is smaller than a width of the extension portion, and all side surfaces of the trench are surrounded by the extension portion.

4. The semiconductor device of claim 2, wherein the pad portion includes first to Nth sides (where N is a natural number),
wherein the extension portion includes first to kth extension portions respectively extending from first to kth sides (where k is a natural number greater than or equal to 2 and less than or equal to N) among the first to Nth sides of the pad portion, and
wherein the trench includes first to kth trenches respectively disposed in the first to kth extension portions.

5. The semiconductor device of claim 4, wherein the first to kth trenches are separated from each other.

6. The semiconductor device of claim 4, wherein two or more adjacent trenches, among the first to kth trenches, are connected to each other, and
wherein at least some of the first to kth trenches are not connected to each other.

7. The semiconductor device of claim 2, wherein, in a plan view, in a direction perpendicular to an extending direction of the extension portion, the trench is divided into two portions with a part of the extension portion interposed therebetween.

8. The semiconductor device of claim 7, wherein the two portions of the trench have the same width in the direction perpendicular to the extending direction.

9. The semiconductor device of claim 7, wherein the pad portion includes first to Nth sides (where N is a natural number),
wherein the extension portion includes first and second extension portions respectively extending from first and second sides of the pad portion, the first and second sides of the pad portion being adjacent to each other,
wherein the trench includes first and second trenches respectively formed in the first and second extension portions,
wherein the first trench is divided into two portions, with a part of the first extension portion interposed therebetween in a direction perpendicular to an extending direction of the first extension portion, and
wherein the second trench is divided into two portions, with a part of the second extension portion interposed therebetween in a direction perpendicular to an extending direction of the second extension portion.

10. The semiconductor device of claim 9, wherein one of the two portions of the first trench, which is adjacent to the second side of the pad portion, and one of the two portions of the second trench, which is adjacent to the first side of the pad portion, are connected to each other.

11. The semiconductor device of claim 7, wherein the pad portion includes first to Nth sides (where N is a natural number),
wherein the extension portion includes first and second extension portions respectively extending from first and second sides of the pad portion, the first and second sides of the pad portion being adjacent to each other, and
wherein the trench surrounds a corner of the pad portion, which is defined by the first side and the second side.

12. The semiconductor device of claim 1, wherein a depth of the trench is smaller than a thickness of the redistribution conductive layer.

13. The semiconductor device of claim 12, wherein the pad portion and the extension portion are physically and electrically connected to each other by a part of the redistribution conductive layer, which is located under the trench.

14. The semiconductor device of claim 12, wherein, in a direction perpendicular to an extending direction of the extension portion, a width of the trench is the same as a width of the extension portion.

15. The semiconductor device of claim 12, wherein the pad portion includes first to Nth sides (where N is a natural number),
wherein the extension portion is extended from adjacent first to kth sides (where k is a natural number greater than or equal to 2 and less than or equal to N), among the first to Nth sides of the pad portion, and
wherein the trench has a shape surrounding the first to kth sides of the pad portion in the extension portion.

16. The semiconductor device of claim 1, wherein the lower structure includes a conductive pattern and an insulating layer covering the conductive pattern, the conductive pattern and the insulating layer being disposed at an uppermost portion of the lower structure, and
wherein the semiconductor device further comprises:
a contact penetrating through the redistribution insulating layer and the insulating layer to connect with the conductive pattern.

17. The semiconductor device of claim 10, wherein a thickness of the redistribution insulating layer is greater than a thickness of the insulating layer.

18. The semiconductor device of claim 1, wherein the lower structure includes a multi-layered conductive pattern and a multi-layered insulating layer in which the multi-layered conductive pattern is embedded, and
wherein at least one insulating layer among the multi-layered insulating layer has a lower dielectric constant than the redistribution insulating layer.

19. The semiconductor device of claim 1, wherein the lower structure includes a multi-layered conductive pattern and a multi-layered insulating layer in which the multi-layered conductive pattern is embedded, and
wherein at least one insulating layer among the multi-layered insulating layer has a higher moisture absorption rate than the redistribution insulating layer.

20. The semiconductor device of claim 18, wherein a conductive pattern among the multi-layered conductive pattern, which is embedded in the insulating layer having a lower dielectric constant than the redistribution insulating layer, includes copper.

21. The semiconductor device of claim 1, wherein the redistribution pad includes a first redistribution pad and a second redistribution pad to which the same power is applied, and
wherein the redistribution conductive layer connects the first redistribution pad and the second redistribution pad.

22. The semiconductor device of claim 1, wherein the protective layer includes an insulating polymer material.

23. The semiconductor device of claim 1, further comprising:
   a connection terminal connected to the redistribution pad.

\* \* \* \* \*